(12) United States Patent
Franz et al.

(10) Patent No.: US 6,858,792 B2
(45) Date of Patent: Feb. 22, 2005

(54) TOOL-LESS COUPLING ASSEMBLY (75) Inventors: John P. Franz, Houston, TX (US);
Wade D. Vinson, Magnolia, TX (US);
Joseph R. Allen, Tomball, TX (US);
David W. Deis, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 10/324,693

(22) Filed: Dec. 19, 2002

(65) Prior Publication Data
US 2004/0118584 A1 Jun. 24, 2004

(51) Int. Cl.⁷ ............................ H01L 23/26; H05K 7/20
(52) U.S. Cl. ...................... 174/16.1; 361/720; 361/722; 165/80.3
(58) Field of Search ..................... 174/16.3; 361/704, 361/712, 720, 722; 165/80.3

(56) References Cited
U.S. PATENT DOCUMENTS

| | | | |
|---|---|---|---|
| 5,808,236 A | 9/1998 | Brezina et al. | 174/16.3 |
| 6,055,159 A * | 4/2000 | Sun | 361/704 |
| 6,180,874 B1 | 1/2001 | Brezina et al. | 174/16.3 |
| 6,188,131 B1 | 2/2001 | Nereng | 257/718 |
| 6,252,773 B1 | 6/2001 | Werner | 361/704 |
| 6,449,157 B1 * | 9/2002 | Chu | 361/704 |
| 6,473,306 B2 * | 10/2002 | Koseki et al. | 361/704 |
| 6,477,049 B1 * | 11/2002 | Lin | 361/704 |
| 6,618,253 B1 * | 9/2003 | Szu et al. | 361/719 |
| 6,731,505 B1 * | 5/2004 | Goodwin et al. | 361/719 |
| 6,731,506 B1 * | 5/2004 | Dong et al. | 361/719 |
| 6,735,085 B2 * | 5/2004 | McHugh et al. | 361/719 |
| 2002/0036891 A1 * | 3/2002 | Lo | 361/704 |

* cited by examiner

Primary Examiner—Hung V. Ngo (57) ABSTRACT

Embodiments of the present invention overcome the deficiencies of the prior art by providing a tool-less, lever actuated, robust yet tolerant, high load delivery, low-profile component retention assembly for coupling components together. The assembly may include a plate and a lever coupled to the plate.

29 Claims, 6 Drawing Sheets

TOOL-LESS COUPLING ASSEMBLY

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND

1. Field of the Invention

This disclosure generally relates to methods and apparatus for coupling components to a circuit board.

2. Background Information

Conventionally, an electrical device (e.g., a processor) is mounted in a socket on a printed circuit board that includes a plurality of integrated circuits secured thereto. Heat dissipation may affect the operation of the processor and thus it is desirable to have a highly effective heat sink for the processor to remove heat generated by the processor. Heat sinks are often attached to the processors/circuit boards by way of thermally conductive epoxy/tapes, a spring-based metal clip, plastic devices, or spring/screw combinations.

The use of thermally conductive epoxy to mount a heat sink onto the surface of a printed circuit board may be a significantly complex manufacturing procedure thereby increasing the overall cost and complexity of manufacturing. For example, there may be a considerable level of difficulty to depositing an epoxy layer of uniform thickness between the circuit board and the heat sink. The heat sink and the circuit board must be pressed together with a certain amount of pressure for a certain amount of time and in a certain orientation. Failure to control these variables (pressure, time, and orientation) carefully may prevent proper operation of the heat sink. Furthermore, an effective technique to easily separate the heat sink from the processor once the interface has been heated is not known to exist.

As an alternative to epoxy, a spring-based metal clip can be used to retain the heat sink on the circuit board by snapping onto a BGA socket or edge of an ASIC interposer. Such a clip, however, creates a significant drawback. Specifically, the bowed configuration of the spring-based clip causes a large portion of the clip to protrude above the top surface of the heat sink taking away valuable fin surface area. Furthermore, in high power processor applications, the heat sink required for a given processor may have a much larger footprint than the processor itself. This need for such large heat sinks makes the use of wire clips incapable of supporting these heavy objects and puts high stresses on soldered joints.

A third mechanism for attaching heat sinks to processors/circuit boards includes using plastic components to hold the heat sink in place for thermal compression and structural constraint. Although plastics are beneficial due to their electrical insulation, they are inadequate for sustaining the forces and high temperatures associated with heat sinks used on high powered processors due to inevitable creep, reducing their effectiveness and potential catastrophic failure.

Finally there is a majority of systems designed that incorporate screws and springs combined with standoffs and/or brace structures to mount the heat sinks to the system. Apart from providing a structurally sound solution this design path is disastrous due volume of loose parts to track, assemble and properly tighten. One of the most significant drawbacks is the fact that a tool is required to perform installation or service.

With some heat sinks, the processor is installed into a socket on the circuit board and retained in place by a locking mechanism that may be integral to the socket. Processors may be installed onto a socket by hand and it is up to the installer to ensure proper alignment of the processor pins with the holes on the socket. Once the processor is installed, the heat sink is then affixed to the top of the processor by a thermally conductive interface. The size of the heat sink may be large enough to prevent unlocking and removing of the processor while the heat sink is installed. In these situations, the heat sink must be removed from the processor before the processor can be removed from the socket.

Therefore, there remains a need in the art for methods and apparatus that allow for heat sinks to be installed and uninstalled from a processor or other electrical device without the need for special rework instructions or tools, and performed in an intuitive, user friendly, easy manner. If a large heat sink is intended to be used and that heat sink size in turn requires a large force to hold it in place for shipping, there remains a need for a lever to provide mechanical advantage to apply that load. Furthermore, due to the large number of tolerance variations in PCBs, soldered joints, ASIC package heights, etc. there remains a need for a device that can be compliant and accept these variations while still providing equal load distribution.

BRIEF SUMMARY

Embodiments of the present invention include a tool-less retention assembly for coupling components together. The assembly may comprise a plate and a lever coupled to the plate.

BRIEF DESCRIPTION OF THE DRAWINGS

For a more detailed description of the embodiments of the present invention, reference will now be made to the accompanying drawings, wherein.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The term "couple" or "couples" is intended to mean either an indirect or direct electrical connection. Thus, if a first device couples to a second device, that connection may be through a direct electrical connection, or through an indirect electrical connection via other devices and connections. Also, the term "board" may be used to refer to a printed circuit board or any type of structure to which components are mounted and interconnected.

In the description that follows, like parts are marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness.

DETAILED DESCRIPTION OF EMBODIMENTS OF THE INVENTION

The following discussion is directed to various embodiments of the invention. Although one or more of these embodiments may be preferred, the embodiments disclosed should not be interpreted or otherwise used as limiting the scope of the disclosure, including the claims, unless otherwise specified. In addition, one skilled in the art will understand that the following description has broad application, and the discussion of any embodiment is meant only to be exemplary, and not intended to intimate that the scope of the disclosure, including the claims, is limited to these embodiments.

There are shown in the drawings, and herein will be described in detail, various embodiments of the invention with the understanding that the disclosure is to be considered merely an exemplification of the principles of the invention, and is not intended to limit this disclosure including the claims to those embodiments illustrated and described herein.

Figure 1:
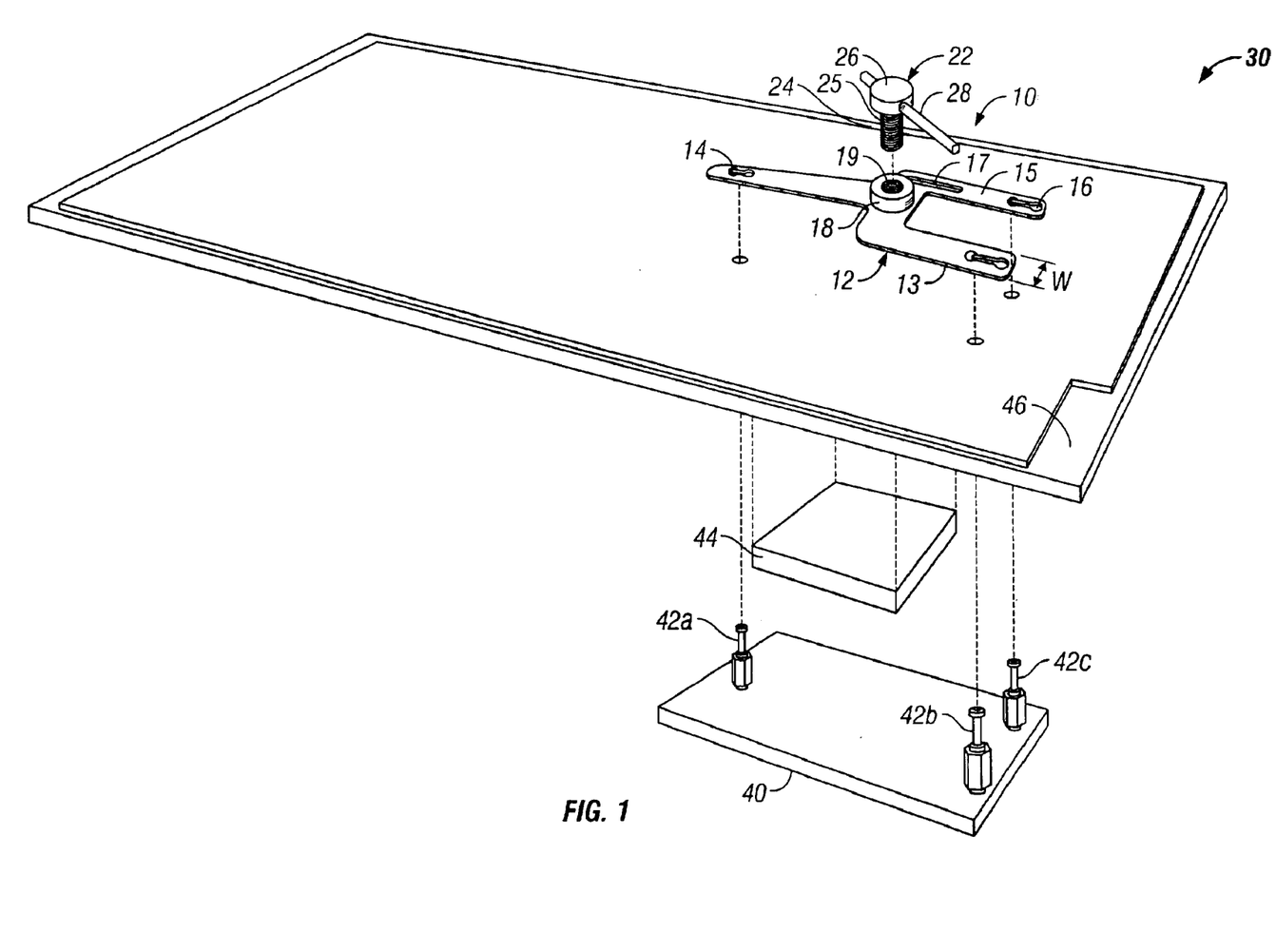
FIG. 1 shows an exploded schematic representation of a tool-less lever actuated assembly in accordance with embodiments of the invention.
Figure 3A:
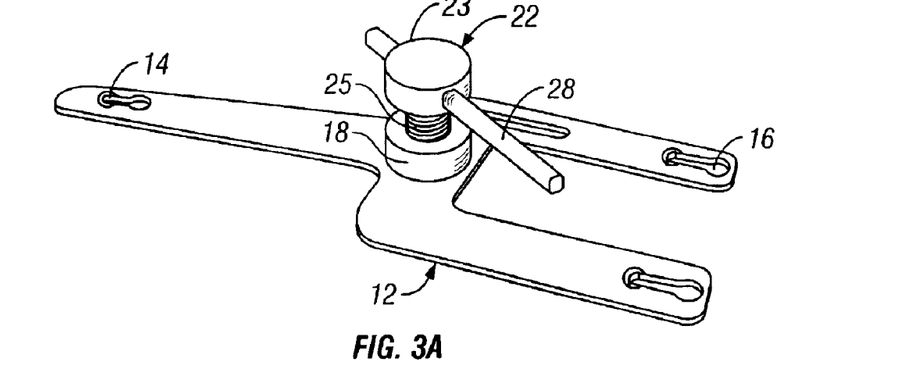
FIGS. 3A and 3B include schematic representations of the assembly of FIG. 1 in unlocked and locked positions in accordance with embodiments of the invention.
Figure 3B:
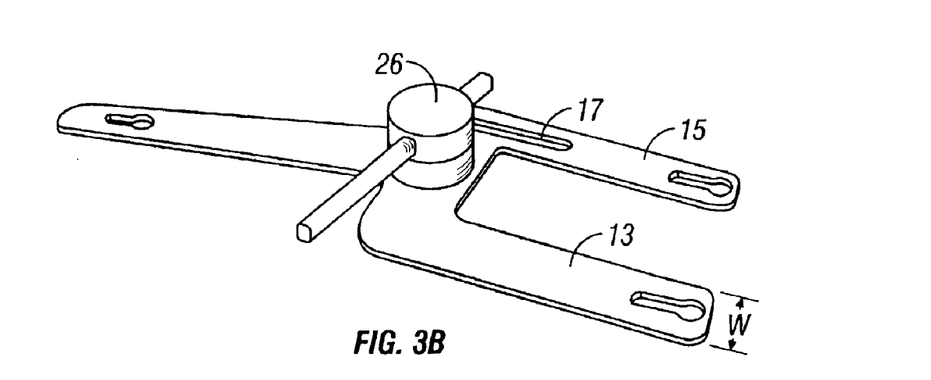

Referring initially to FIG. 1, an exploded view of a tool-less lever-actuated heat sink retention assembly 10 in accordance with embodiments of the invention is shown along with a heat sink 40, a processor 44, and a circuit board 46, collectively referred to as heat sink/processor/circuit board assembly 30. Referring now to FIGS. 1, 3A and 3B, retention assembly 10 may include a pronged plate 12 and a fastener 22. Fastener 22 may comprise any structure having a threaded portion, such as a screw. Retention assembly 10 may also include a torque-limiting device such as a brake or spring (not shown). Torque-limiting devices may be used to prevent over-tightening of fastener 22. In some embodiments, fastener 22 may comprise a torque-limiting device, where the fastener 22 is a torque thumb fastener.

Pronged plate 12 may have countersinks 14 to receive pins 42a, 42b and 42c from a heat sink 40. In some embodiments, countersinks 14 are connected to tear drop shaped channels 16, which may act to funnel pins 42 into countersinks 14. Pronged plate 12 may have a hole 18 with threads 19 for receiving the threaded shank 24 of fastener 22. Pronged plate 12 may be fabricated from a suitable metal, such as stainless steel.

In some embodiments, pronged plate 12 may be formed generally into a "Y" shape as shown. Additionally, in some embodiments, pronged plate 12 may be keyed. A keyed installation may help to ensure that the user does not incorrectly install the pronged plate 12.

In addition, when a "Y" shaped pronged plate 12 is used, it may be desirable to vary the widths W of the prongs 15, remove a predetermined material section 17 from the prongs 15, or a combination of both to help ensure equal loading on the plate. For some embodiments, simulations such as finite element analysis (FEA) may be performed in order to determine stresses, deflections, and resulting loads in accordance with known or customized techniques. The information obtained from such simulations may then be used to adjust the dimensions of pronged plate 12 to ensure equal loading on the plate.

Fastener 22 may include a shank 24, a head 26, and a lever 28. As explained above, shank 24 may have threads 25 for threadingly engaging threads 19 in pronged plate 12. Lever 28 may allow the user to adjust the load, by twisting the lever.

Figure 2:
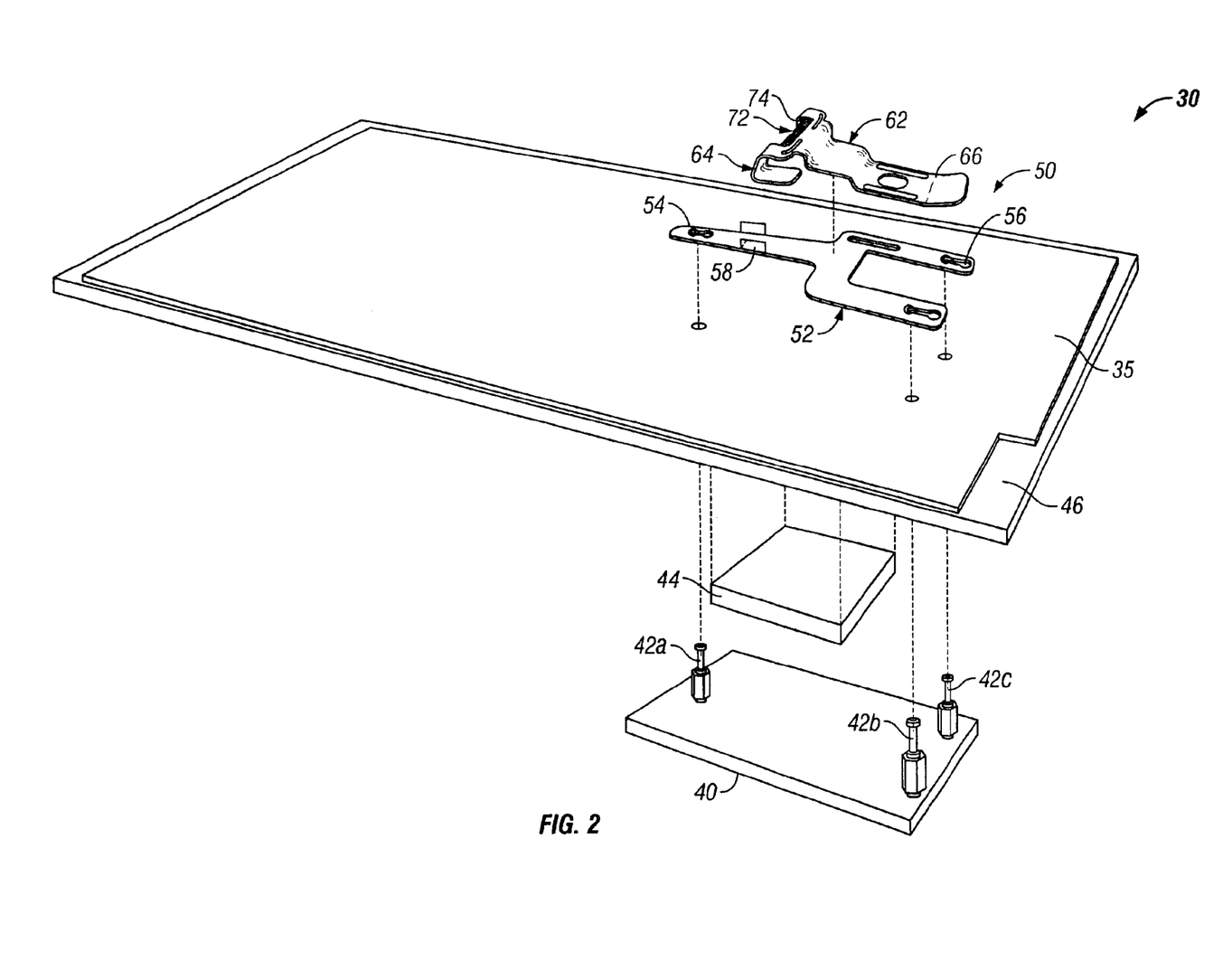
FIG. 2 shows a tool-less lever actuated heat sink assembly in accordance with other embodiments of the invention.
Figure 5A:
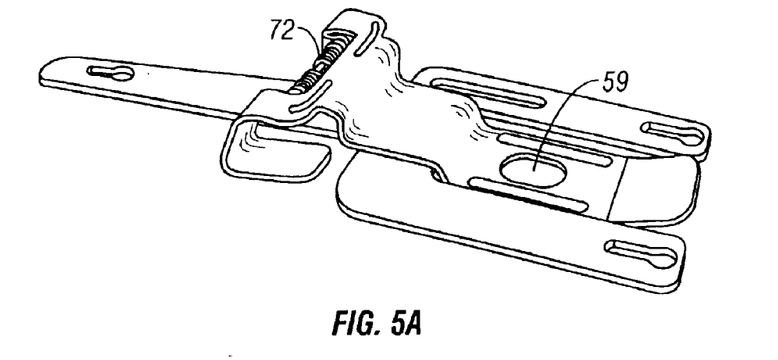
FIGS. 5A and 5B show schematic representations of the assembly of FIG. 2 in locked and unlocked positions in accordance with embodiments of the invention.
Figure 5B:
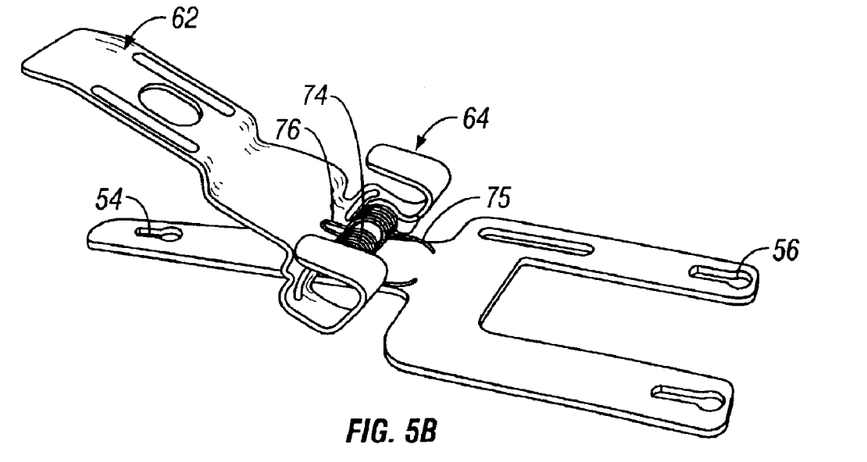

Referring now to FIGS. 2, 5A and 5B, a tool-less lever actuated heat sink retention assembly 50 is shown in accordance with other embodiments. Retention assembly 50 may include a pronged plate 52, a cam lever 62, and an axle 72. Because the pronged plate 52 of FIG. 2 has similar requirements to the pronged plate 12 of FIG. 1, it will not be discussed in further detail, except to mention that pronged plate 52 may have at least two receiving portions 58 for receiving axle 72 and may not have a hole with threads for receiving the shank of a fastener.

Cam lever 62 may include a cam portion 64 and a lever portion 66. Cam portion 64 rotates around axle 72, which may connect to pronged plate 52 via receiving portions 58 and biased to pronged plate 52 by one or more springs 74 (or other biasing devices) wrapped around, or otherwise coupled to, axle 72. In some embodiments, the ends (not shown) of axle 72 are flanged in order to keep axle 72 within receiving portions 58. In some embodiments, a first portion 75 of spring 74 may be engaged against plate 52 and a second portion 76 of spring 74 may be engaged against cam lever 62.

Figure 7A:
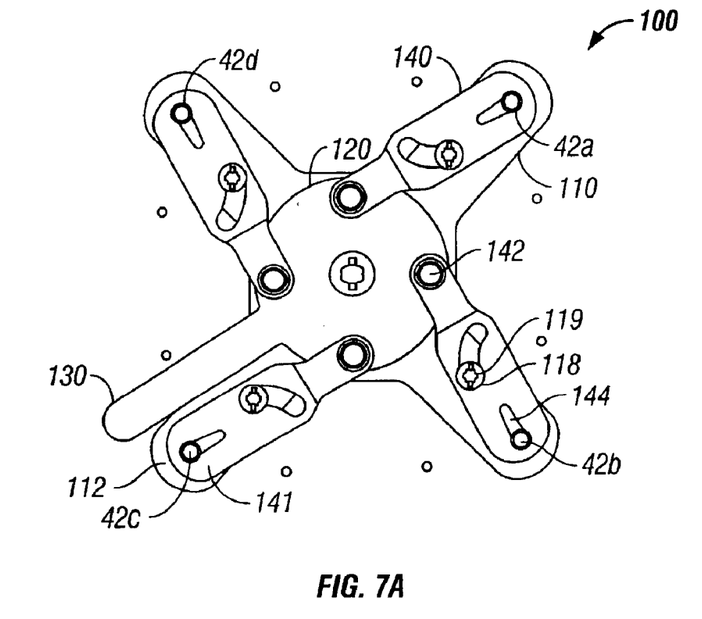
FIGS. 7A and 7B show schematic representations of an assembly in unlocked and locked positions in accordance with embodiments of the invention.
Figure 7B:
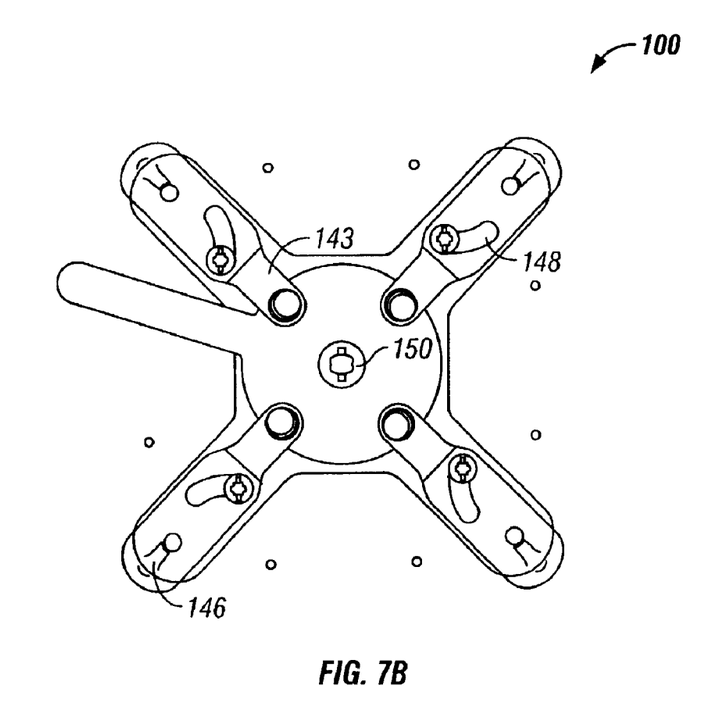

Referring now to FIGS. 7A and 7B, a tool-less lever actuated heat sink retention assembly 100 is shown in accordance with yet other embodiments. Retention assembly 100 may include a pronged plate 110, a lever mount 120, a lever arm 130, and a plurality of movable arms 140. Pronged plate 110 may include a plurality of slots (not shown) for receiving pins 42a,b,c,d from heat sink 40, a threaded hole (not shown) for receiving a fastener 150, and a plurality of connector pins 118.

Lever mount 120 may be attached to pronged plate 110 via fastener, or guidepost, 150. Fastener 150 may comprise any structure having a threaded portion (not specifically shown), such as a screw. Fastener 150 may be received into a threaded hole (not shown) in pronged plate 110.

Arms 140 may be connected to both lever mount 120 and pronged plate 110. In some embodiments, arms 140 connect to lever mount 120 via rolled over stakes 142, creating a pivoting hinge 143. Arms 140 may be connected to pronged plate 110 via connector pins 118. A portion of each connector pin 118 may be embedded in pronged plate 110 and the end or "head portion" 119 may be received into a slot 148 in arms 140. In some embodiments, slot 148 may be crescent or equivalent shaped.

Arms 140 may also have countersinks 144 to receive pins 42a, 42b, 42c, 42d from heat sink 40. In some embodiments, countersinks 144 connect to tear drop shaped channels 146, which act to funnel pins 42 into countersinks 144. The ends 141 of arms 140 may be inclined.

In some embodiments, pronged plate 110 may be formed generally into an "X" shape as shown. The ends 112 of pronged plate 110 may be inclined to coincide with the ends 141 of arms 140 to provide lifting action as the arms 140 slide over plate 110 during rotation of lever 130. Additionally, in some embodiments, pronged plate 110 may be keyed. As explained above, a keyed installation helps to ensure that the user does not incorrectly install the pronged plate 110. Plate 110 may also have an adhesive backing combined with a covering 35 to secure it to the circuit board 46 to provide a permanently attached solution for the user and protect the PCA components and user from possible damage during actuation.

Operation

FIGS. 3A and 3B show the tool-less lever actuated heat sink retention assembly 10 in locked and unlocked positions, respectively. In order to install retention assembly 10 in the locked position, the following actions may be performed. Referring back to FIG. 1, the pronged plate 12 may be placed under the heat sink/processor/circuit board assembly 30 such that pins 42 projecting from the heat sink 40 may be received in teardrop shaped channels 16 of plate 12. Pronged plate 12 may be adjusted so that pins 42 are pushed into countersinks 14 at the ends of teardrop shaped channels 16. In some embodiments, pins 42 hold pronged plate 12 into the desired position, which forces pronged plate 12 to bow, or deflect, in the center of the plate.

Simply by way of further understanding and without limitation, the initial deflection and loading on pins 42 from pronged plate 12 may be similar to those exhibited in a cantilever, whose deflection δ, is modeled with the following equation:

$$\delta = \frac{EFbt^3}{4L^3} \quad (1)$$

where: δ=deflection
E=modulus of elasticity
F=force in cantilever
b=width of plate
t=thickness of plate
L=length of plate Assuming, for example and without limitation, that the user is trying to impose a 40 lb. load on the heat sink by hand, approximately 20 lbs. may be placed on the single pin 42*a* and approximately 10 lbs. may be placed on each of the other two pins 42*b,c*. Per equation (1) above, the calculated deflection δ is approximately 0.10". Therefore, with respect to the embodiment of FIGS. 3A and 3B, the fastener 22 must be tightened so that the center of the heat sink 40 is lifted 0.10" to apply the force F on the pins 42.

Once the pins 42 are in place, the user may twist the lever 28 of fastener 22 so that threads 25 of the fastener 22 threadingly engage with the threads 19 of pronged plate 12. The user may twist lever 28 until a desired load is achieved. As described above, for a 40-lb. load, the fastener 22 must be tightened so that the center of the heat sink 40 is lifted 0.10". In some embodiments, the load is distributed evenly across the pins 42.

In order to unlock the retention assembly 10, the user twists lever 28 in the opposite direction until loading is reduced enough so as to be able to remove the heat sink. The fastener 22 preferably acts as a screw jack, which is used to overcome a heavy pressure or raise a heavy weight W of by a much smaller force F applied at the lever 28.

Figure 4:
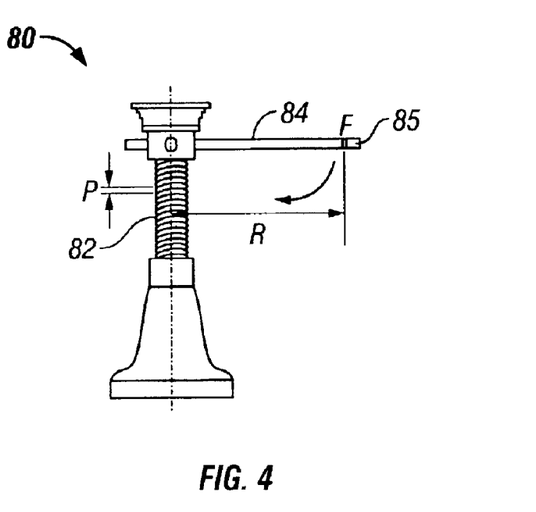
FIG. 4 illustrates a schematic representation of a screw jack or inclined plane in accordance with embodiments of the invention.

FIG. 4 shows the mechanics behind a screw jack 80. R represents the length of the lever 84 and P the pitch of the fastener 82, or the distance advances in one complete turn. Neglecting friction, the following rule is used: The force F applied to the fastener lever 84 in the clockwise direction multiplied by the distance through which it moves in one complete turn is equal to the weight lifted times the distance through which it is lifted in the same time. In one complete turn, the end 85 of the lever 84 moves through the circumference of a circle—the circumference is 2ΠR. This is the distance through which the force F is exerted.

Therefore from the rule above:

$$F \times 2\Pi R = W \times P \quad (2)$$

and $$F = \frac{W \times P}{2\pi R} \quad (3)$$

By way of example, suppose R equals 1 in., P equals 1/10 in. and the weight to be lifted equals 40 lb., then the force required at F is approximately 0.64 lb. Notice that the calculated deflection δ from above is equal to the pitch P of the fastener. This means that, neglecting friction, 0.64 lb. at F will raise 40 lb. at W in one complete turn of the fastener, but the weight lifted moves much slower than the force applied at F.

The stress of the pronged plate 12 may be calculated by the following equation:

$$S = \frac{EFt^3}{2L^2} \quad (4)$$

where: S=Stress
E=modulus of elasticity
F=force in cantilever
t=thickness of plate
L=length of plate By using a material thickness having a stress that is a fraction of the maximum of the full hard material, the user is afforded design flexibility for higher loading with a safety factor.

The cantilever model is how the heat sink-processor-circuit board-retention assembly generally operates. However, when a shock is experienced by the assembly, the tips of the prongs 15 of the pronged plate 12 may come in contact with the circuit board 46. This changes the loading from a cantilever to a simple beam. In this case, the deflection, δ, may be modeled as:

$$\delta = \frac{4EFbt^3}{L^3} \quad (5)$$

where: δ=deflection
E=modulus of elasticity
F=force in beam
b=width of plate
t=thickness of plate
L=length of plate The simple beam model allows for 16× the load given the material and mechanical constraints. As a result, the user can apply relatively heavy loads to the heat sink/processor/circuit board/retention assembly without fear of moving the heat sink or damaging the processor. In addition, in the simple beam model, any further deflection may transition the pronged plate 12 to be flat against the circuit board 46 (locally to the pin 42) and, in essence, creates an immovable layer of metal resistant to heavy forces.

FIGS. 5A and 5B show the tool-less lever actuated heat sink retention assembly 50 in locked and unlocked positions. In order to install retention assembly 50 in the locked position, the following actions may be taken. Referring back to FIG. 2, the pronged plate 52 may be placed under the heat sink/processor/circuit board assembly 30 such that pins 42 projecting from the heat sink 40 are received in teardrop shaped channels 56 of plate 52. Pronged plate 52 may then be adjusted so that pins 42 are pushed into countersinks 54 at the ends of tear drop shaped channels 56. Pins 42 have the same calculated deflection δ as above (approximately 0.10").

Once the pins are in place, the lever portion 62 may be rotated about axis 72 so that it is flush with pronged plate 52. During this maneuver, the cam portion 64 is rotated around axle 72. The cam portion 64 places a load off center (eccentric) from axle 72, forcing lever portion 62 to stay in a locked position.

In some embodiments, a covering 35 may be placed between retention assembly 50 and circuit board 46. The covering 35 may be preferably fabricated from a non-conducting material such as plastic. When a covering 35 is used, a slot 59 may be notched in lever portion 62 that aligns with an "ant hill" protrusion (not shown) in the covering 35. The alignment of slot 59 and the protrusion give the user feedback if installation is not correct by not allowing the lever 62 to lay flush with plate 52.

In order to unlock the retention assembly 50, the user simply pulls and rotates lever portion 62 in the opposite direction, forcing the cam portion 64 to push against the circuit board 46 and reduce loading to approximately zero. The torsional spring 74 provides resistance against lever portion 62, forcing it to stay in an unlocked position, which aids the user by placing the lever portion 62 in the correct orientation for subsequent uses.

Figure 6:
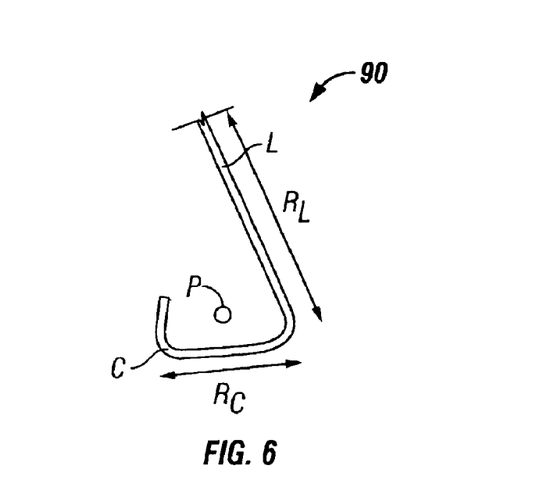
FIG. 6 shows a schematic representation of a cam lever in accordance with embodiments of the invention.

FIG. 6 illustrates the mechanics behind cam lever 90. $R_C$ represents a length of the cam C that rotates about pivot P, and $R_L$ represents the length of the lever L. Neglecting friction, the following rule is used: The weight W to be lifted multiplied by cam length $R_C$ is equal to the force F needed to raise weight W multiplied by lever length $R_L$ (assuming the force is applied at the end of lever L). Therefore:

$$W \times R_C = F \times R_L \quad (6)$$

and $$F = \frac{W \times R_C}{R_L} \quad (7)$$

Suppose the weight W to be lifted is again 40 lbs., $R_C$ is equal to 1 cm, and $R_L$ is equal to 8 cm, then the force required at F is approximately 5 lbs.

Referring back to FIGS. 7A and 7B, the tool-less lever actuated heat sink retention assembly 100 is shown in unlocked and locked positions, respectively. In order to install retention assembly 100 in the locked position, the following steps may be performed. Similar to the first two embodiments, the pronged plate 110 may be placed under the heat sink/processor/circuit board assembly 30 such that pins 42a, 42b, 42c, 42d projecting from the heat sink 40 are received into the slots (not shown) of pronged plate 110 and teardrop shaped channels 146 of arms 140. Lever arm 130 may be pushed so that lever mount 120 rotates in a clockwise manner. Fastener, or guidepost, 150 properly translates the rotational movement of lever arm 130 and lever mount 120 into the translational movement of arms 140.

Arms 140 may be adjusted so that pins 42 are pushed into countersinks 144 at the ends of tear drop shaped channels 146. In some embodiments, pins 42 may hold arms 140 into the desired position, which push against pronged plate 110, and force arms 140 to deflect. The deflection of arms 140 may be similar to a wedge-like action, where arms 140 are pushed under pins 42 and the load is distributed according to simple beam equation (5).

Figure 8:
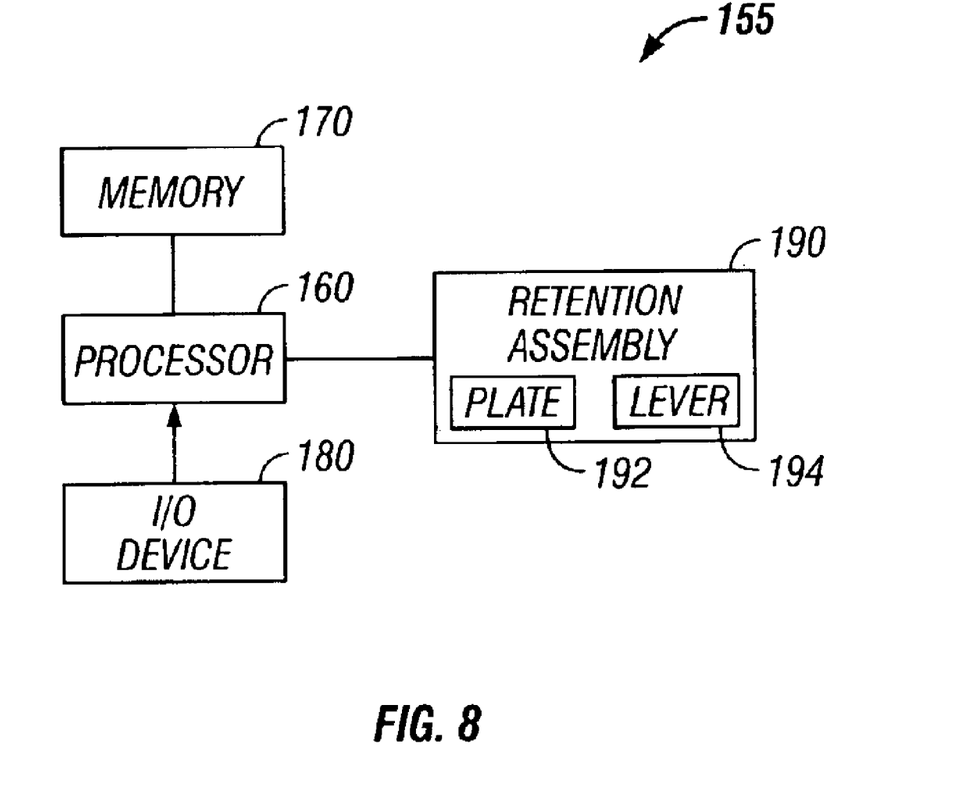
FIG. 8 shows a block diagram of a computer system in accordance with embodiments of the invention.

The various embodiments of retention may be used, for example, in a computer system, such as that illustrated in FIG. 8. Referring now to FIG. 8, an embodiment of a computer system 155 is shown. Computer system 155 may include any of a variety of components such as a processor 160, memory 170, and an input/output device 180 (e.g., a keyboard, mouse, trackball, etc.). Retention assembly 190 (in accordance with any of the embodiments of the invention) may be used in conjunction with the processor 160.

While embodiments of the invention are susceptible to various modifications and alternative forms, specific embodiments thereof are shown by way of example(s) in the drawings and associated description. It should be understood, however, that the drawings and detailed description are not intended to limit the claims to the particular form disclosed, but on the contrary, the intention is to cover all modifications, equivalents and alternatives falling within the spirit and scope of the present invention as defined by the appended claims. For example, this disclosure is not limited to heat sinks and processors. In general, the retention clip can be used to couple any two components together in a computer system or in other systems. Also, the retention clip may be temporarily or permanently used to couple the components.

What is claimed is:

1. A tool-less retention assembly for coupling a first component to a second component, comprising:
   a plate having countersinks; and
   a lever coupled to said plate,
   wherein movement of said lever allows a user to impose a predetermined load on the assembly such that the plate is in contact with a first component and wherein said plate is capable of receiving pins from a second component through said countersinks.

2. The assembly, according to claim 1, wherein said lever is located on a fastener having a threaded shank and said plate having a hole for threadingly engaging said fastener.

3. The assembly according to claim 2 wherein said plate includes channels for receiving the pins.

4. The assembly according to claim 2 wherein said plate comprises a pronged plate.

5. The assembly according to claim 4 wherein the prongs of said plate have varied widths.

6. The assembly according to claim 2 wherein said fastener includes a handle.

7. The assembly according to claim 2 further comprising a torque-limiting device that prevents the over-tightening of said fastener.

8. The assembly according to claim 2 wherein said first component comprises a printed circuit board, wherein said second component comprises a heat sink, and wherein a processor is mounted on said printed circuit board and is held in place by said heat sink.

9. The assembly, according to claim 1, further comprising:
   an axle, wherein said lever comprises a cam lever that rotates around said axle; and said plate has a receiving portion for engaging said axle.

10. The assembly according to claim 9 wherein the ends of said axle are flanged.

11. The assembly according to claim 9 wherein a spring is wrapped around said axle.

12. The assembly according to claim 11 wherein a first portion of said spring is engaged against said plate and wherein a second portion of said spring is engaged against said cam lever.

13. The assembly according to claim 9 wherein said first component is a printed circuit board, wherein said second component is a heat sink, and wherein a processor is mounted on said printed circuit board and is held in place by said heat sink.

14. The assembly according to claim 9 further comprising a covering located between said plate, cam lever and said printed circuit board.

15. The assembly according to claim 14 wherein said covering is fabricated from a non-conductive material.

16. The assembly according to claim 14 wherein said covering includes a protrusion and wherein said cam lever includes a slot for alignment with said protrusion in the covering.

17. An assembly, comprising:
   an integrated circuit;
   a heat sink;
   a circuit board to which said integrated circuit and heat sink mate; and
   a heat sink retention clip comprising:
      an axle;
      a cam lever that rotates around said axle;
      a plate having a receiving portion for engaging said axle;
      wherein said cam lever and plate are in contact with said circuit board, wherein said plate has countersinks to receive pins from said heat sink, and wherein said chip is mounted on said circuit board and is held in place by said heat sink.

18. A method of installing and retaining a heat sink onto an integrated circuit mounted to a circuit board, the method comprising steps:
   (1) placing the heat sink on top of the integrated circuit;
   (2) inserting alignment pins that are mounted to the heat sink into receptacles located on the top of the circuit board;
   (3) placing a heat sink retention clip on the bottom of the circuit board, wherein the alignment pins are received into countersinks of the clip; and
   (4) locking the clip.

19. The method of claim 18 wherein the method is performed without any tools.

20. A computer system, comprising:
   a processor;
   memory;
   an input/output device; and
   a retention assembly comprising:
      a plate; and
      a lever in communication with said plate,
      wherein movement of said lever provides a mechanical advantage that allows a user to impose a predetermined load on said retention assembly such that said plate is in contact with a first side of a first component and applies a load to a second component that is disposed on a second side of the first component.

21. A tool-less retention assembly for coupling a first component to a second component, comprising:
   a plate; and
   a means for imposing a predetermined load on the assembly such that the plate is in contact with a first component and wherein said plate is capable of receiving pins from a second component, wherein the first component is positioned between the second component and said plate.

22. A heat sink retention assembly comprising:
   a plate disposed on a first side of a circuit board;
   a plurality of prongs extending from a center portion of said plate, wherein at least one of said plurality of prongs attaches to a pin that is connected to a heat sink disposed on a second side of the circuit board; and
   a lever coupled to said plate, wherein movement of said lever urges the heat sink toward the circuit board.

23. The heat sink retention assembly of claim 22, wherein said lever comprises a fastener having a threaded shank, wherein said plate threadingly engages the fastener.

24. The heat sink retention assembly of claim 22, wherein said lever comprises a cam lever that rotates around an axle mounted to said plate.

25. The heat sink retention assembly of claim 24, further comprising a spring wrapped around said axle.

26. The heat sink retention assembly of claim 25, wherein a first portion of said spring is engaged against said plate and wherein a second portion of said spring is engaged against said cam lever.

27. An assembly comprising:
   a circuit board having a first side and a second side;
   a processor coupled to the second side of said circuit board;
   a heat sink disposed adjacent to the second side of said circuit board;
   a plurality of pins attached to said heat sink and extending through said circuit board;
   a plate disposed adjacent to the first side of said circuit board;
   a plurality of prongs extending from a center portion at said plate, wherein said plurality of prongs connects to said plurality of pins; and
   a lever coupled to said plate, wherein movement of said lever urges said heat sink toward said circuit board.

28. The assembly of claim 27, wherein said lever comprises a fastener having a threaded shank that engages said plate.

29. The assembly of claim 27, wherein said lever comprises a cam that rotates relative to said plate.

* * * * *

UNITED STATES PATENT AND TRADEMARK OFFICE
CERTIFICATE OF CORRECTION

PATENT NO. : 6,858,792 B2  Page 1 of 1
APPLICATION NO. : 10/324693
DATED : February 22, 2005
INVENTOR(S) : John P. Franz et al.

It is certified that error appears in the above-identified patent and that said Letters Patent is hereby corrected as shown below:

IN THE CLAIMS

Claim 27, Column 10, line 49, delete "at" and insert therefor --of--

Signed and Sealed this

Twentieth Day of May, 2008

JON W. DUDAS
*Director of the United States Patent and Trademark Office*